US006040629A

United States Patent [19]

Shimizu et al.

[11] Patent Number: 6,040,629

[45] **Date of Patent: *Mar. 21, 2000**

[54] SEMICONDUCTOR INTEGRATED CIRCUIT HAVING SILICIDED ELEMENTS OF SHORT LENGTH

[75] Inventors: Satoshi Shimizu; Hidekazu Oda, both of Tokyo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/868,738

[22] Filed: Jun. 4, 1997

[30] Foreign Application Priority Data

Feb. 5, 1997 [JP] Japan .................................... 9-022426

[51] Int. Cl.[7] ........................... H01L 23/48; H01L 23/52; H01L 29/40

[52] U.S. Cl. .......................... 257/770; 257/309; 257/317; 257/442; 438/655; 438/683; 438/964

[58] Field of Search .................................... 257/309, 317, 257/412, 770; 438/655, 683, 964

[56] References Cited

U.S. PATENT DOCUMENTS

| | | | |
|---|---|---|---|
| 5,021,353 | 6/1991 | Lowrey et al. . | |
| 5,102,816 | 4/1992 | Manukonda et al. . | |
| 5,491,099 | 2/1996 | Hsu . | |
| 5,498,558 | 3/1996 | Kapoor | 438/260 |
| 5,518,960 | 5/1996 | Tsuchimoto . | |
| 5,554,566 | 9/1996 | Lur et al. | 438/655 |
| 5,554,871 | 9/1996 | Yamashita et al. . | |
| 5,739,573 | 4/1998 | Kawaguchi | 257/384 |

FOREIGN PATENT DOCUMENTS

| | | |
|---|---|---|
| 63-318779 | 12/1988 | Japan . |
| 3-288443 | 12/1991 | Japan . |
| 5-47785 | 2/1993 | Japan . |
| 6-13402 | 1/1994 | Japan . |
| 6-326122 | 11/1994 | Japan . |
| 7-106280 | 4/1995 | Japan . |
| 9-8292 | 1/1997 | Japan . |

OTHER PUBLICATIONS

M. Sekine, et al., "Self–Aligned Tungsten Strapped Source/Drain and Gate Technology Realizing the Lowest Sheet Resistance for Sub–quarter Micron CMOS", 1994 IEEE, pp. 19.3.1–19.3.4.

*Primary Examiner*—Olik Chaudhuri
*Assistant Examiner*—Howard Weiss
*Attorney, Agent, or Firm*—Oblon, Spivak, McClelland, Maier & Neustadt, P.C.

[57] ABSTRACT

A surface of a conductive member such as a gate electrode provided with a silicon layer is roughened. The roughened silicon layer is silicified so that its width is substantially increased, whereby phase transition of the silicide layer is simplified. Thus, the resistance of the refined silicide layer is reduced due to the simplified phase transition.

3 Claims, 10 Drawing Sheets

5 12 7 7 2 2 8 4 8 3 6 1a 1

F I G. 1 9
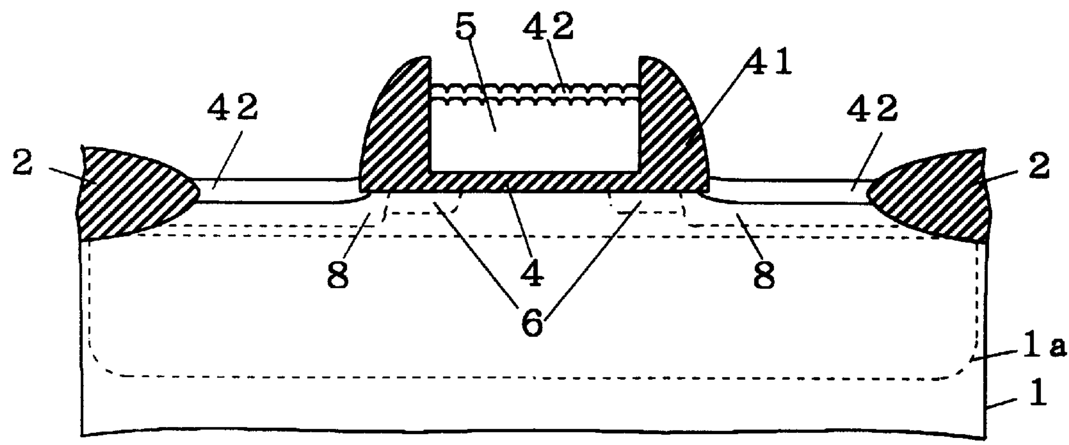
F I G. 2 0
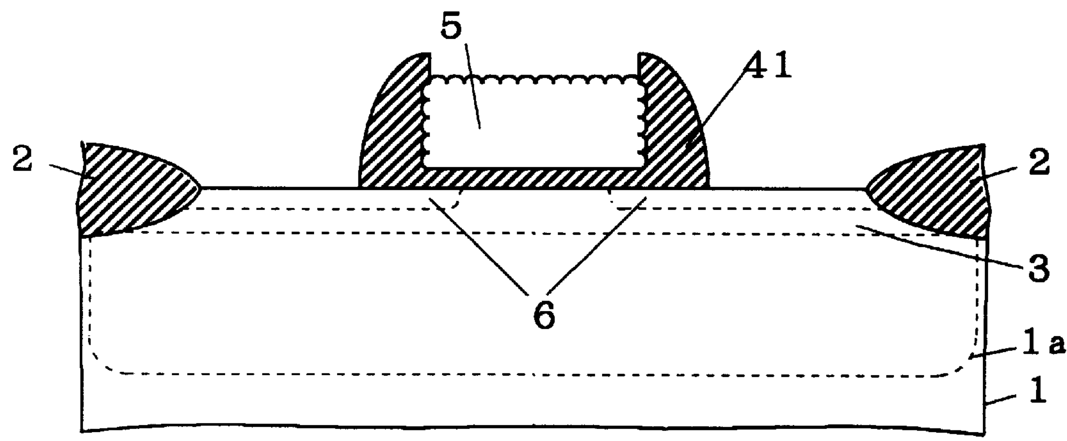
F I G. 2 1
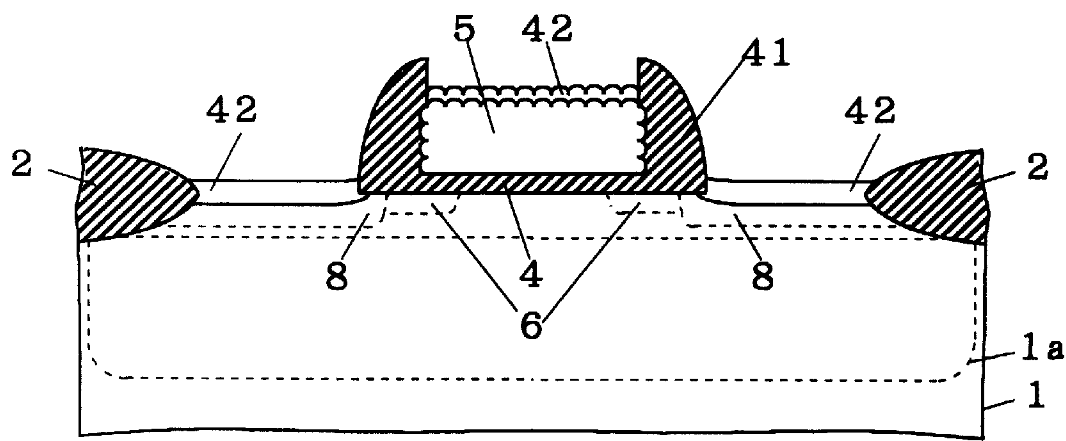

SEMICONDUCTOR INTEGRATED CIRCUIT HAVING SILICIDED ELEMENTS OF SHORT LENGTH

BACKGROUND OF THE INVENTION

1. Field of the Invention

The present invention relates to a silicide layer forming method employed for a semiconductor integrated circuit which is obtained by forming a number of electronic components on a substrate or the like and a semiconductor integrated circuit including a silicide layer, and more particularly, it relates to a silicide layer forming method by a salicide process employing a refractory metal silicide film for enabling a high-speed operation and attaining high reliability.

2. Description of the Background Art

An example of a general salicide (self-aligned silicide) process for forming a refractory silicide film is described with reference to FIGS. 22 to 25.

First, a well 1*a*, isolation oxide films 2, and an impurity layer 3 which controls a threshold voltage are formed on a silicon substrate 1. Thereafter a silicon oxide film 4 of 6.5 nm in thickness, for example, is formed on the silicon substrate 1, and a polycrystalline silicon layer for defining a gate electrode is deposited on the oxide film 4 in a thickness of 200 nm. An impurity is added to this polycrystalline silicon layer, which in turn is patterned by a photolithographic step and thereafter anisotropically etched for forming a gate electrode 5.

Then, LDD (lightly doped drain) layers 6 which are also referred to as extension layers are formed, and thereafter an oxide film is deposited by CVD (chemical vapor deposition). This oxide film is etched back by reactive ion etching (hereinafter referred to as RIE), for forming side walls 7 consisting of silicon oxide on right and left sides of the gate electrode 5.

Then, high-concentration source/drain layers 8 are formed by high-concentration ion implantation, and thereafter heat treatment is performed for activation. FIG. 22 is a sectional view showing a state after completion of the activation.

Then, the salicide process is carried out.

In the salicide process, a surface of the silicon substrate 1 is first cleaned by proper pretreatment, and thereafter a metal film 9 is deposited on the structure shown in FIG. 22 (see FIG. 23).

Then, the silicon substrate 1 shown in FIG. 23 is heated under a proper atmosphere for forming silicide films 10 by the silicon substrate 1 and the polycrystalline silicon forming the gate electrode 5 (see FIG. 24). The composition of these silicide films 10 is expressed as MSix, assuming that M represents a metal element forming the metal film 9, for example, where x represents the ratio of silicon to the metal. In this case, short-time heat treatment (rapid thermal annealing) is generally performed through a lamp annealing furnace. The heat treatment which is performed through the lamp annealing furnace immediately after deposition of the metal film 9 is hereafter referred to as first RTA.

At this time, no silicide reaction takes place on upper portions of the isolation oxide films 2 and the side walls 7 due to absence of silicon, and the unreacted metal film 9 remains at least on these upper portions (see FIG. 24). Then, the metal film 9 still containing the unreacted metal M etc. is selectively removed while leaving the silicide films 10 formed by the reacted silicide MSix (see FIG. 25). Basically, the salicide process is ended in the aforementioned step.

However, when the silicide films formed through the aforementioned process are made of titanium silicide TiSix, for example, further heat treatment is performed at a high temperature or over a long time for forming titanium silicide films of $TiSi_2$ having a different composition or crystal structure, since the electric properties of titanium silicide (TiSix) are insufficient. Also in case of changing the composition or crystal structure of titanium silicide, short-time heat treatment is generally performed through a lamp annealing furnace. The short-time heat treatment employed for changing the composition or crystal structure of such silicide films is hereinafter referred to as second RTA. Due to the salicide process employing the aforementioned steps, an electrode can advantageously be selectively formed only on a region exposing a silicon surface on the silicon substrate 1.

In recent years, on the other hand, integrated circuits are implemented with higher density of integration such that the gate length or a silicide wire of a planar MOS transistor which is a kind of MIS transistor is refined, for example. Due to the aforementioned structure of the conventional MIS transistor fabricated through the salicide process, further, phase transition from a C49 phase to a C54 phase hardly takes place in the crystal structure even by second RTA in case of titanium silicide ($TiSi_2$) when the gate length or the width of the silicide wire is refined to below 0.5 μm, leading to such a problem that the sheet resistance of the titanium silicide films is abruptly increased. FIG. 26 shows exemplary gate dependency of gate resistance in titanium silicide ($TiSi_2$).

SUMMARY OF THE INVENTION

According to a first aspect of the present invention, a silicide layer forming method includes a step of forming a conductor member which is provided on its surface with a silicon layer of a predetermined width, a roughening step of roughening the silicon layer, and a step of silicifying the silicon layer thereby forming a silicide layer, and the predetermined width is narrower than a width hardly causing phase transition of the silicide layer when the silicon layer is flat.

According to a second aspect of the present invention, the roughening step has a step of roughening the silicon layer with a substantially semispherical projection, and the predetermined width is up to $(2/\pi)$ times the width hardly causing the phase transition.

According to a third aspect of the present invention, the step of silicifying the silicon layer has a step of silicifying the silicon layer with titanium, and the width hardly causing the phase transition is 0.5 μm.

According to a fourth aspect of the present invention, the diameter of the semispherical projection is larger than 0.05 μm.

According to a fifth aspect of the present invention, the semispherical projection has a radius smaller than $(2/\pi)$ times the width hardly causing the phase transition of the silicide layer.

According to a sixth aspect of the present invention, the roughening step has a step of roughening the silicon layer with hot phosphoric acid.

According to a seventh aspect of the present invention, side walls which are L-shaped in section are formed on both sides of the conductor member.

According to an eighth aspect of the present invention, the silicide layer forming method further includes a step of forming side walls which are higher than the conductor member on both sides of the conductor member.

The present invention is also directed to a semiconductor integrated circuit. According to a ninth aspect of the present invention, a semiconductor integrated circuit comprises an insulating film, and a conductor member which is provided on the insulating film and insulated by the insulating film for supplying an electric charge, and side walls being provided on said insulating film and holding said conductor member, while the conductor member includes a silicide layer which is provided on its surface with a number of undulations and the conductor member held between the side walls has only a width which is not more than a width hardly causing phase transition of silicide when the silicide layer is flatly formed.

In the silicide layer forming method according to the first aspect of the present invention, the width of the silicide layer can be substantially increased to that readily causing phase transition, whereby the sheet resistance of the silicide layer can be reduced and a semiconductor integrated circuit which is suitable for miniaturization can be effectively obtained.

In the silicide layer forming method according to the second aspect of the present invention, the resistance value of the silicide layer can be readily reduced to the width $2/\pi$ times that hardly causing phase transition by forming the semispherical projection.

In the silicide layer forming method according to the third aspect of the present invention, it is possible to form a titanium silicide layer of about 0.3 to 0.5 $\mu$m in width whose resistance value is reduced by phase transition to a C54 phase on a semiconductor integrated circuit, whereby a semiconductor integrated circuit which is suitable for miniaturization can be effectively obtained.

In the silicide layer forming method according to the fourth aspect of the present invention, the resistance value of the titanium silicide layer can be reduced by sufficiently causing phase transition, whereby a semiconductor integrated circuit which is suitable for miniaturization can be effectively obtained.

In the silicide layer forming method according to the fifth aspect of the present invention, the projection can be formed in the ratio of at least one along the width of the silicide layer, whereby dispersion of the resistance value can be reduced and a semiconductor integrated circuit which is suitable for mass production can be effectively obtained.

In the silicide layer forming method according to the sixth aspect of the present invention, the width of the silicide layer can be simply increased to that substantially readily causing phase transition due to the roughening with hot phosphoric acid and the sheet resistance of the silicide layer can be reduced, whereby a semiconductor integrated circuit which is suitable for miniaturization can be effectively obtained.

In the silicide layer forming method according to the seventh aspect of the present invention, the distance between a gate electrode and a source/drain layer can be increased along surfaces of the side walls by rendering the side walls L-shaped in section, whereby the yield of the semiconductor integrated circuit can be effectively improved by reducing occurrence of short-circuiting across the gate electrode and the source/drain layer.

In the silicide layer forming method according to the eighth aspect of the present invention, the distance between the gate electrode and the source/drain layer can be increased along the surfaces of the side walls by rendering the side walls higher than the gate electrode, whereby the yield of the semiconductor integrated circuit can be effectively improved by reducing occurrence of short-circuiting across the gate electrode and the source/drain layer.

In the semiconductor integrated circuit according to the ninth aspect of the present invention, the resistance value of the silicide layer can be suppressed with a width smaller than that hardly causing phase transition of silicide due to the projections/depressions formed on the surface of the silicide layer and the conductor member forming the semiconductor integrated circuit can be refined, whereby miniaturization can be effectively attained.

An object of the present invention is to improve the degree of integration of a semiconductor integrated circuit by providing a technique of avoiding short-circuiting across a gate electrode and a source/drain layer in formation of a silicide layer, or by providing a technique of obtaining a silicide film whose sheet resistance is not increased even if the width of a silicified part such as an upper portion of a gate electrode or a source/drain layer is small.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 16 to FIG. 19 are sectional views for illustrating a first method of fabricating a MOS transistor according to an embodiment 3 of the present invention;

FIG. 20 and FIG. 21 are sectional views for illustrating a second method of fabricating a MOS transistor according to the embodiment 3 of the present invention;

DESCRIPTION OF THE PREFERRED EMBODIMENTS

Embodiment 1

A method of fabricating a MOS transistor according to an embodiment 1 of the present invention and a MOS transistor formed by the same are described with reference to FIGS. 1 to 4. FIGS. 1 to 4 are sectional views showing steps of fabricating a MOS transistor according to the embodiment 1 respectively. This MOS transistor is fabricated with application of a silicide layer forming method according to the present invention.

Figure 1:
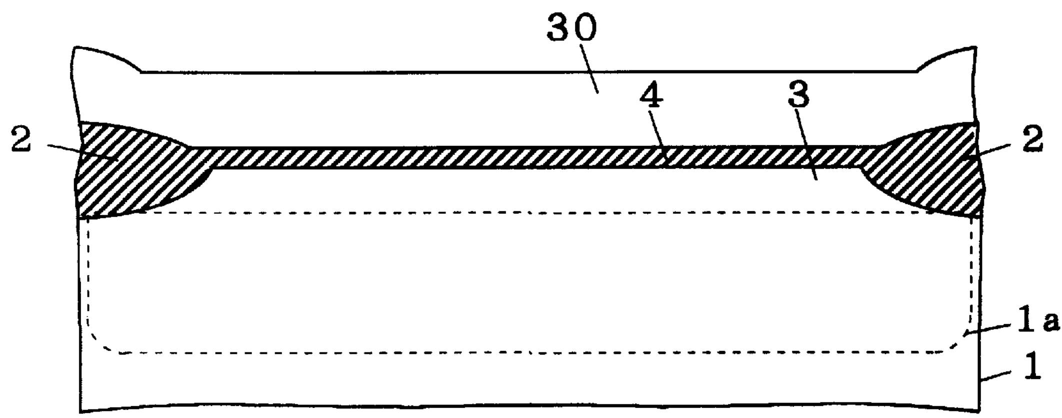
FIG. 1 to FIG. 4 are sectional views for illustrating a first method of fabricating a MOS transistor according to an embodiment 1 of the present invention.

First, isolation oxide films 2, a well 1*a* and an impurity layer 3 for controlling a threshold voltage are formed on a silicon substrate 1 by a conventional method of fabricating a MOSFET. Then, a gate insulating film 4 is deposited on the silicon substrate 1, and an amorphous silicon film 30 is deposited further thereon, as shown in FIG. 1. The amorphous silicon film 30 is deposited at an evaporation temperature of about 520° C. under evaporation pressure of about 2 Torr, with silane ($SiH_4$) at a flow rate of 1300 sccm or disilane ($Si_2H_6$) at a flow rate of 100 sccm. At this time, carrier gas of nitrogen ($N_2$), hydrogen ($H_2$) or helium (He) is fed by about 500 sccm, for example. However, the amorphous silicon film 30 can be formed without feeding such carrier gas.

Figure 2:
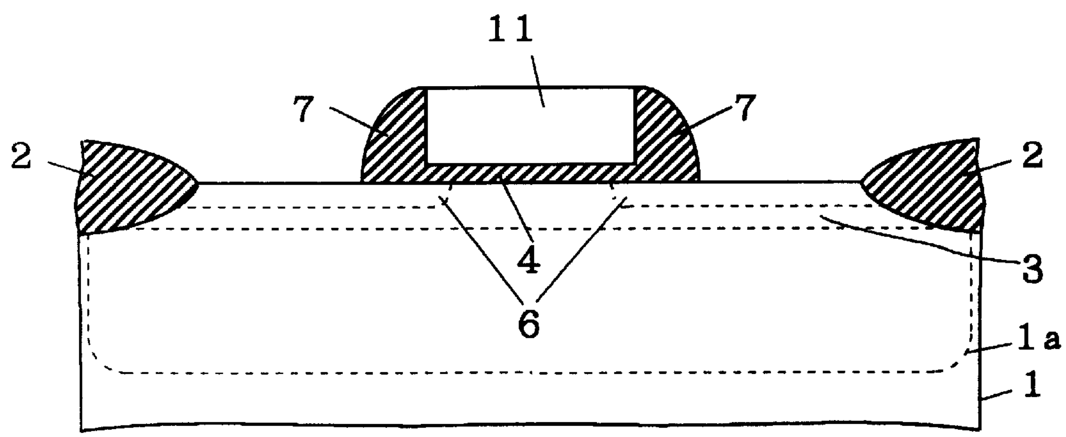

Then, the amorphous silicon film 30 is patterned by a photolithographic process, and thereafter anisotropically etched for forming a gate electrode 11. After formation of LDD layers 6, an insulating film is deposited by CVD at a low temperature causing no crystal growth of amorphous silicon forming the gate electrode 11. The insulating film is prepared from silicon oxide or silicon nitride, for example. The insulating film is etched back for forming side walls 7, as shown in FIG. 2.

Figure 3:
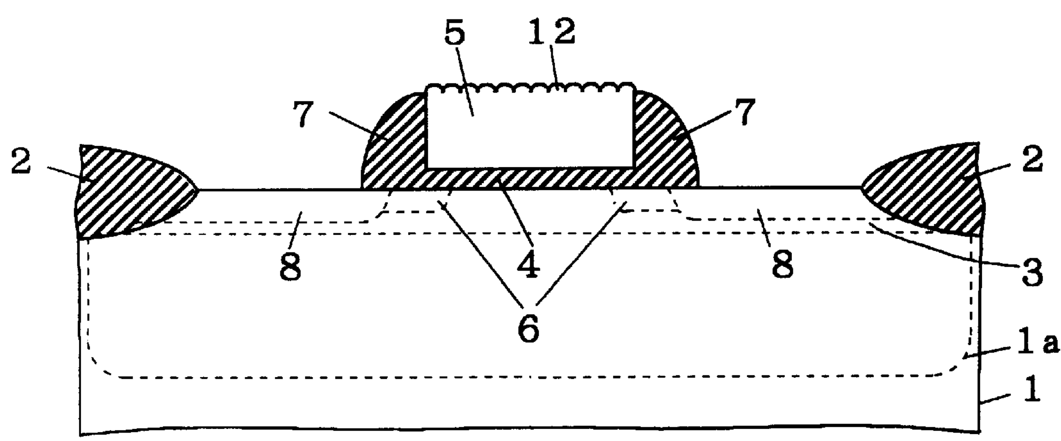
Figure 4:
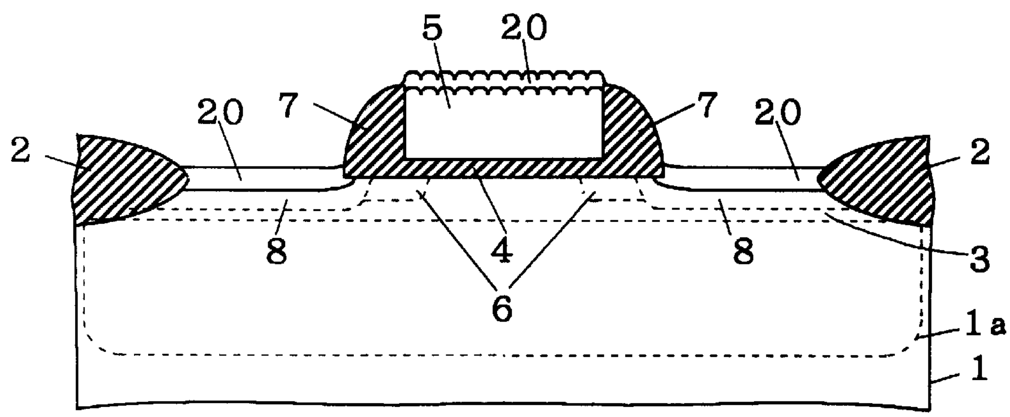

Before or after high-concentration source/drain layers 8 are formed through the side walls 7 serving as masks, disilane ($Si_2H_6$) is adsorbed on a surface of the gate electrode 11 which is made of amorphous silicon in a molecular state, and decomposed on this surface for forming nuclei of polycrystalline silicon. Then, the substrate temperature is increased to about 600 to 700° C., for making crystal growth of amorphous silicon on the basis of the nuclei of polycrystalline silicon formed on the gate electrode 11 consisting of amorphous silicon. Thus, amorphous silicon is converted to polycrystalline silicon, as shown in FIG. 3. Formed in this case is a gate electrode 5 consisting of polycrystalline silicon, which is roughened by a number of semispherical projections 12. Silicide layers 20 are formed on surfaces of the gate electrode 5 and the source/drain layers 8 respectively, as shown in FIG. 4. The diameters of the projections 12 are preferably at least 0.05 $\mu$m for sufficiently attaining an effect of simplifying phase transition, in case of forming titanium silicide ($TiSi_2$) layers of 0.03 to 0.1 $\mu$m in thickness. If the physical gate length is 0.3 to 0.5 $\mu$m, the diameter of each projection 12 is preferably rendered not more than about 0.3 $\mu$m, in order to provide one or more projections 12 for suppressing dispersion of a local effective gate length.

A projection of 0.05 to 0.3 $\mu$m in diameter means a semispherical polycrystalline silicon grain of 0.05 to 0.3 $\mu$m in height, which can be measured by observation with a scanning microscope in general. Roughening treatment is described in "Growth Mechanism of Si Films with Hemispherical Grains" by Toru Tatsumi, Akira Sakai, Taeko Ikarashi and Hirohito Watanabe, Applied Physics, Vol. 61, No. 11, pp. 1147 to 1151 (1992), for example.

Figure 5A:
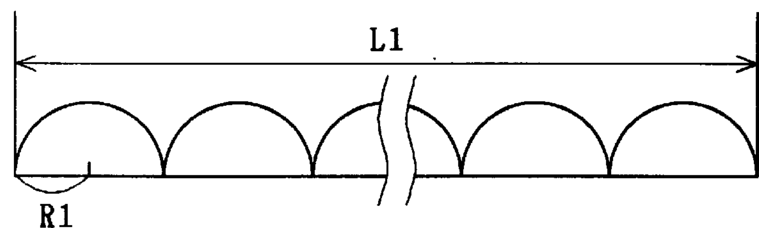
FIGS. 5A and 5B are conceptual diagrams for illustrating shapes of projections/depressions formed on surfaces of silicon layers respectively.
Figure 5B:
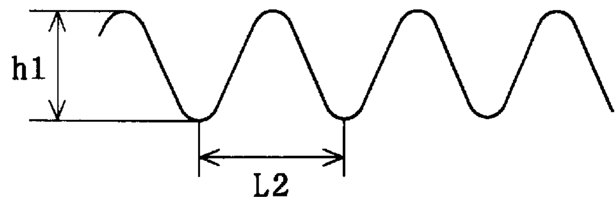

FIG. 5(*a*) is adapted to illustrate the relation between the radius R1 of each projection and the gate length L1. When such projections having the radius R1 are transversely aligned with each other, L1/R1 projections are formed along the gate length direction. The current surface length is expressed as $(\pi/2)\times R1\times 2\times(L1/R1\times 2)$, which is a function depending only on the gate length L1 regardless of the radius R1. Thus, it comes to that the width of the silicide layers 20 is about 1.6 times the gate length.

Due to the aforementioned fabrication steps, it is possible to prevent occurrence of such a phenomenon that phase transition from a C49 phase to a C54 phase is difficult and the gate resistance is increased when the gate length is set in the range of 0.3 to 0.5 $\mu$m in case of forming a titanium silicide ($TiSi_2$) layer on the gate electrode 5, for example. Even if the gate electrode 5 is refined to about 0.3 to 0.5 $\mu$m, therefore, increase of the resistance value can be suppressed by roughening, and the MOS transistor can operate at a higher speed as compared with the prior art.

While silicification of the gate electrode 5 of the MOS transistor has been described with reference to the embodiment 1, a similar process is applicable to a silicide wire. Also in this case, the resistance of the silicide wire can be reduced by roughening an upper part of an amorphous silicon film. Namely, the technique described with reference to the embodiment 1 is employable in case of forming a silicide layer on a fine region such as a semiconductor integrated circuit. This also applies to the following embodiments in common.

Figure 6:
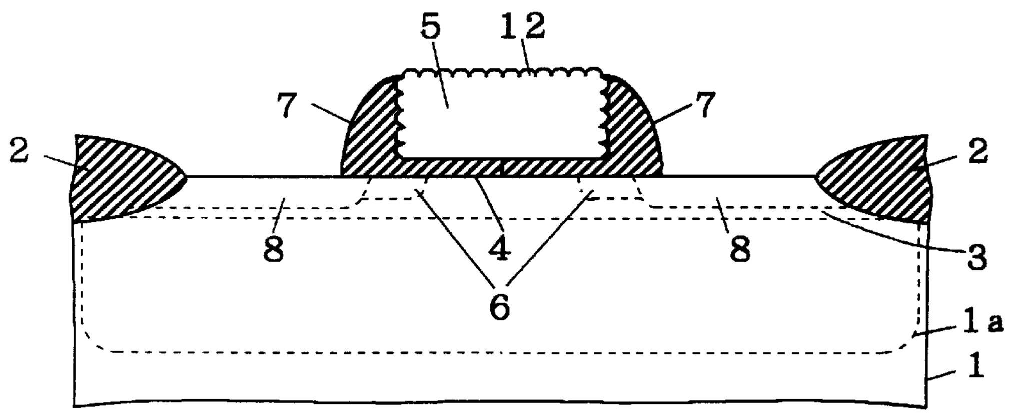
FIG. 6 and FIG. 7 are sectional views for illustrating a second method of fabricating a MOS transistor according to the embodiment 1 of the present invention.

While the amorphous silicon film is roughened after formation of the side walls 7 in the aforementioned embodiment 1, the surface of the gate electrode 5 consisting of amorphous silicon may alternatively be roughened by forming a number of projections on the silicon surface before forming the side walls 7. FIG. 6 shows a sectional shape of a roughened gate electrode 5 consisting of polycrystalline silicon in such case.

Figure 7:
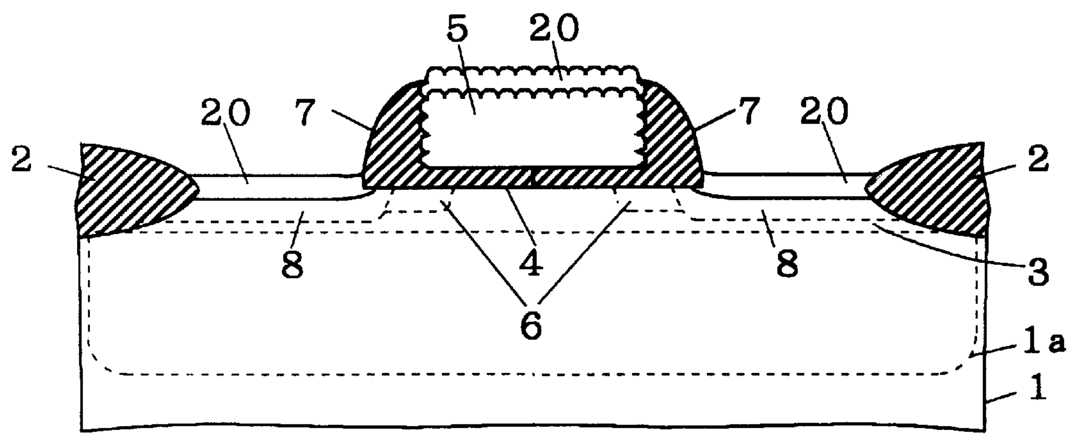

If the surface of the gate electrode 5 is roughened in such a manner, there is a possibility of increasing frequency in occurrence of short-circuiting across the gate electrode 5 and source/drain layers 8 from side surfaces of the gate electrode 5 through side walls 7 due to nuclei of polycrystalline silicon formed on a silicon substrate 1. However, the silicon substrate 1 consisting of single-crystalline silicon is not roughened despite the nuclei of polycrystalline silicon, whereby increase of the frequency in short-circuiting can be prevented by slightly performing anisotropic or isotropic etching after roughening of amorphous silicon thereby removing the nuclei of polycrystalline silicon from the silicon substrate 1. FIG. 6 shows a sectional shape of the silicon substrate 1 which is obtained when a salicide process is carried out after formation of the side walls 7 for forming silicide layers 20 on surfaces of the gate electrode 5 and the source/drain layers 8 respectively. FIG. 7 shows the silicide layers 20 formed by applying a salicide process to the silicon substrate 1 shown in FIG. 6.

Figure 8:
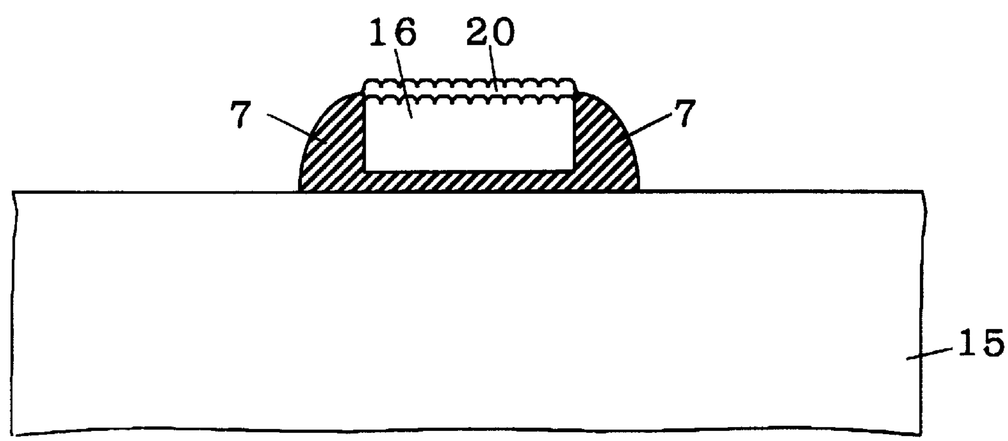
FIG. 8 is a sectional view for illustrating an exemplary silicide wire according to the embodiment 1 of the present invention.
Figure 9:
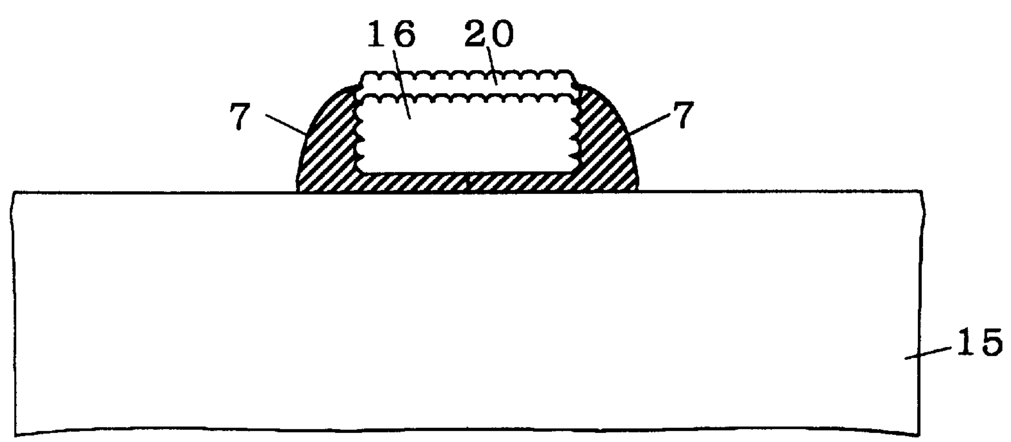
FIG. 9 is a sectional view for illustrating another exemplary silicide wire according to the embodiment 1 of the present invention.

While the embodiment 1 has been described with reference to roughening of the gate electrode surface, the present invention is applicable to any silicide film of 0.5 $\mu$m in width such as a silicide wire 16 having a line width of 0.3 to 0.5 $\mu$m which is formed on an insulating film 15 shown in FIG. 8, for example, for attaining an effect similar to that of the embodiment 1. FIG. 9 is a sectional view showing side walls 7 which can be formed after roughening the silicide wire 16.

A polycrystalline silicon surface can alternatively be roughened with hot phosphoric acid. Such hot phosphoric acid ($H_3PO_4$) is used in a concentration of 70 to 90% at a temperature of 130 to 160° C. Silicon is not further corroded when dissolved in hot phosphoric acid up to its saturation concentration, projections formed in this case are not semispherical as shown in FIG. 5(*a*), but projections/depressions are formed in shapes shown in FIG. 5(*b*). In this case, the substantial width of the silicide layer is increased as the height h1 of the projections/depressions is increased, the cycle L2 is reduced and the number of repetition times is increased. FIGS. 5(*a*) and 5(*b*) are conceptual diagrams employed for facilitating easy understanding of the description, and the projections/depressions are not so symmetrical in practice. When the polycrystalline silicon surface is doped with an impurity and roughened with hot phosphoric acid, the projections/depressions can be increased in size. The projections/depressions can be readily formed with no requirement for control of a corrosion time etc., since silicon dissolved in hot phosphoric acid up to its saturation concentration is not further corroded.

Figure 26:
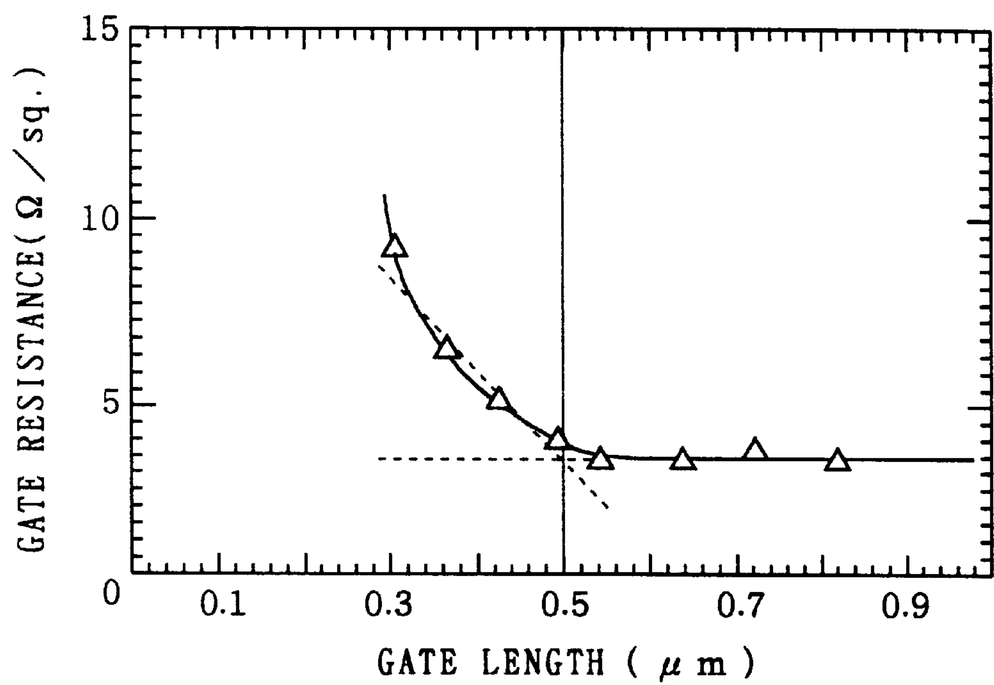
FIG. 26 is a graph showing the relation between gate lengths and gate resistance in a gate electrode made of titanium silicide.

The width (gate length) hardly causing phase transition is defined by a point of intersection between an extension line of a portion hardly changing the resistance value of silicide and that formed by linearly approximating a portion increasing the resistance value to 1.5 times to twice in the graph shown in FIG. 26. These extension lines are shown in dotted lines in FIG. 26.

It may be possible to reduce the width hardly causing phase transition below 0.5 μm in case of converting the silicon surface by ion implantation before deposition of titanium, or by sputtering titanium at a high temperature.

Embodiment 2

A method of fabricating a MOS transistor according to an embodiment 2 of the present invention and a MOS transistor formed by the same are described with reference to FIGS. 10 to 13. FIGS. 10 to 13 are sectional views showing steps of fabricating a MOS transistor according to the embodiment 2 of the present invention. This MOS transistor is fabricated by application of the inventive silicide layer forming method.

First, a silicon substrate 1 provided with an amorphous silicon film 30 is prepared as shown in FIG. 1, similarly to the embodiment 1.

Figure 10:
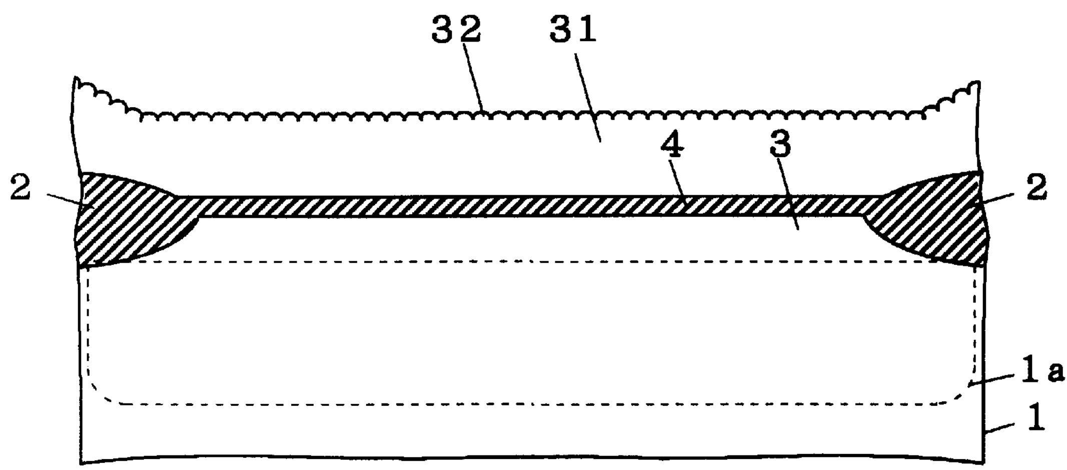
FIG. 10 to FIG. 13 are sectional views for illustrating a first method of fabricating a MOS transistor according to an embodiment 2 of the present invention.
Figure 11:
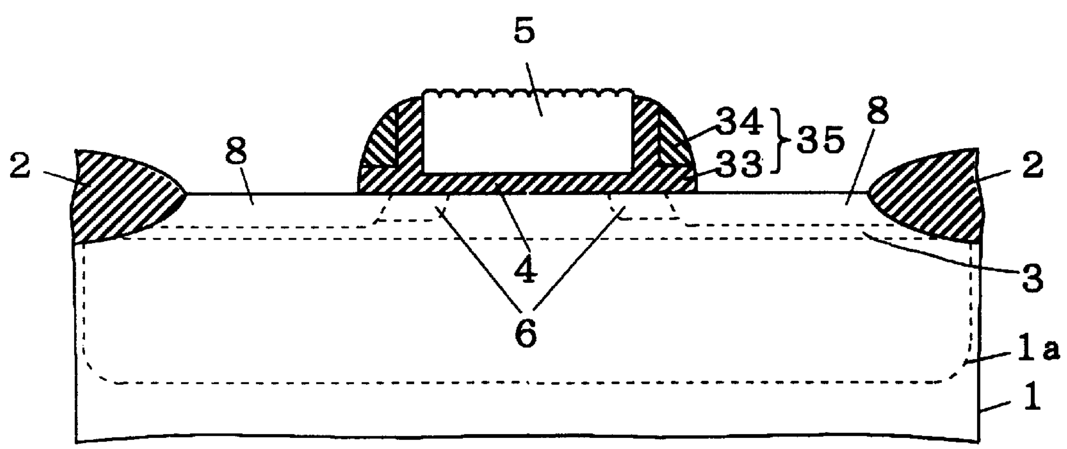

Then, disilane ($Si_2H_6$) is adsorbed on a surface of the amorphous silicon film 30 in a molecular state, and decomposed on this surface for forming nuclei of polycrystalline silicon. Then, the substrate temperature is increased to about 600 to 700° C. for making crystal growth of amorphous silicon on the basis of the nuclei of polycrystalline silicon formed on the amorphous silicon film 30, thereby converting amorphous silicon to polycrystalline silicon, as shown in FIG. 10. Thus formed is a polycrystalline silicon film 31 which is roughened by a number of semispherical projections 30. The diameters of the projections 32 are in a preferable range, similarly to the projections 12.

Then, the polycrystalline silicon film 31 is patterned for forming a gate electrode 5. This gate electrode 5 is employed as a mask for forming LDD layers 6, and thereafter a silicon oxide film 33 is deposited by CVD as a first insulating film of about 150 to 500 Å, for example, and a silicon nitride film 34 is deposited by CVD as a second insulating film of about 300 to 1000 Å, for example. These first and second insulating films are etched back, whereby a state shown in FIG. 11 can be attained.

Then, the silicon nitride film 34 is isotropically etched with hot phosphoric acid hardly corroding polycrystalline silicon and silicon oxide while readily corroding silicon nitride respectively. Due to this isotropic etching, the silicon nitride film 34 is removed for forming side walls 36 having L-shaped sections, as shown in FIG. 12.

Figure 12:
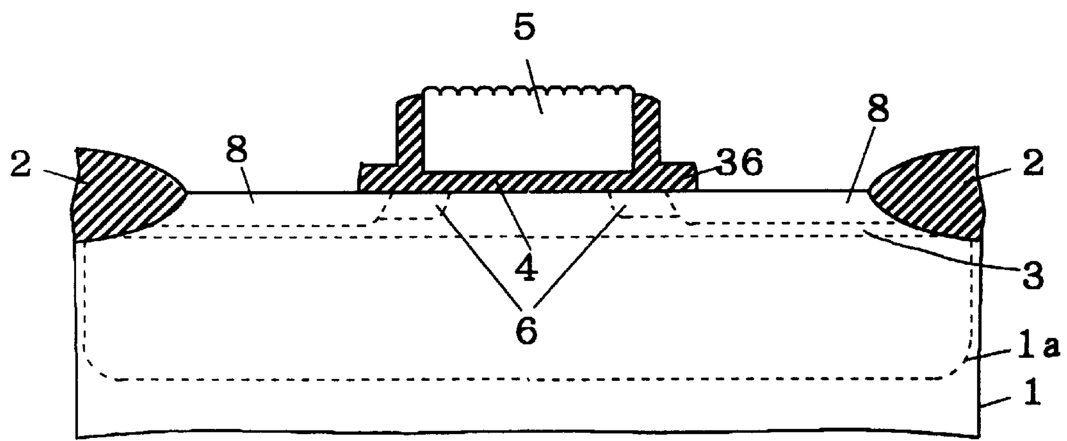
Figure 13:
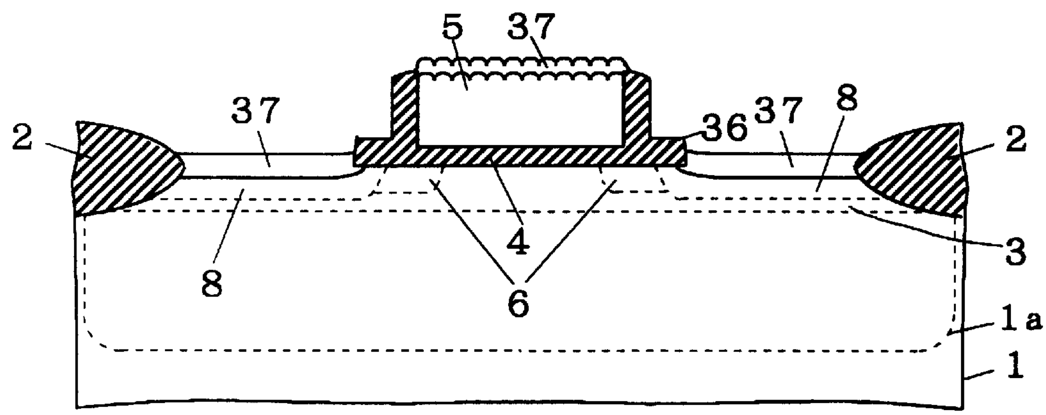
Figure 27:
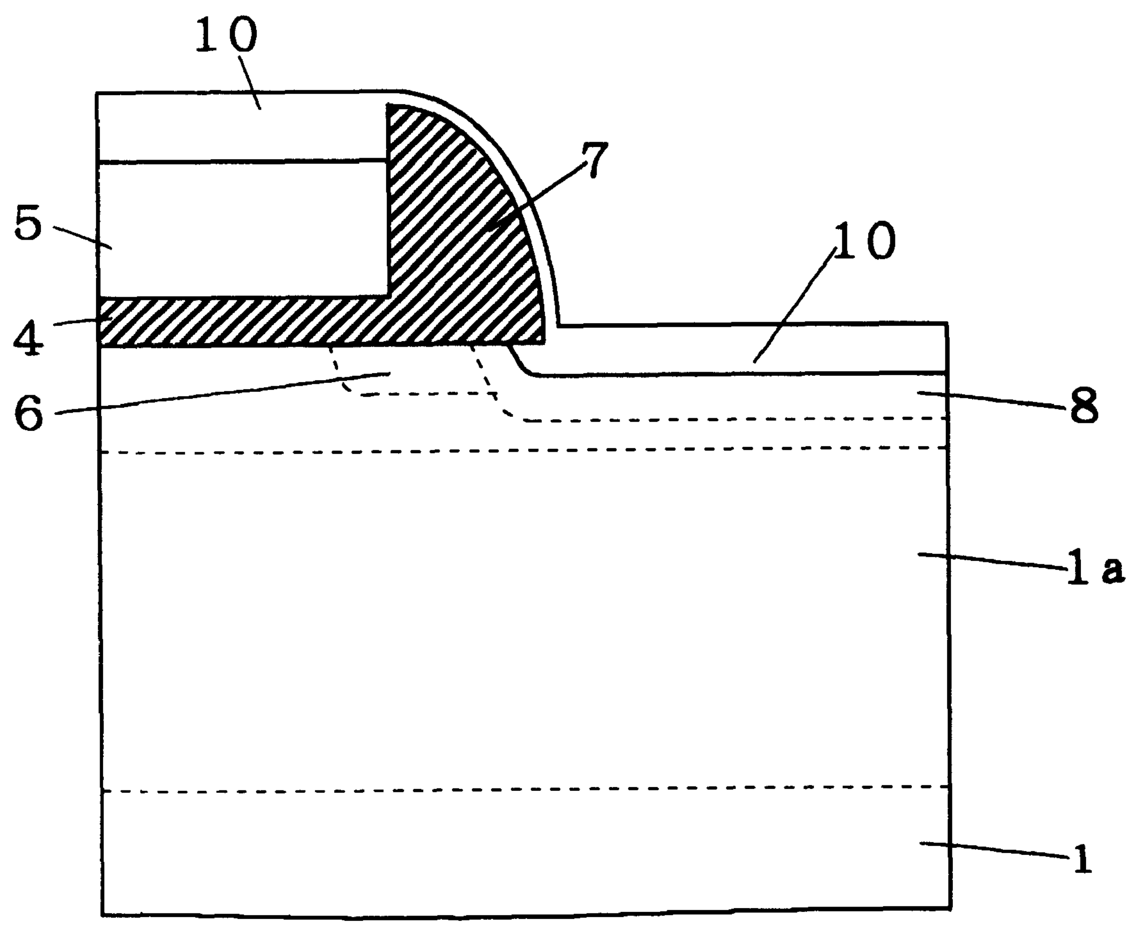
FIG. 27 is a sectional view showing a part of FIG. 25 in an enlarged manner.

A salicide process is applied to the silicon substrate 1 shown in FIG. 12, for forming silicide layers 37 on surfaces of the gate electrode 5 and high-concentration source/drain layers 8 respectively (see FIG. 13). At this time, the distances between an upper portion of the gate electrode 5 and the source/drain layers 8 are substantially increased along the side walls 36 due to the side walls 36 having L-shaped sections, whereby the gate electrode 5 and the source/drain layers 8 can be prevented from short-circuiting caused by silicide growing and creeping along the surfaces of the side walls 36. In general, a silicide layer 10 growing along a side surface of a side wall 7 may cause short-circuiting across a gate electrode 5 and a source/drain layer 8 as shown in FIG. 27, for example. When the gate electrode 5 is roughened, the possibility of short-circuiting across the gate electrode 5 and the source/drain layers 8 may be increased due to the roughening. Therefore, it is particularly effective to form the side walls 36 in L-shaped sections.

The silicide layer 37 formed on the gate electrode 5 in the aforementioned manner in accordance with the embodiment 2 has low sheet resistance, similarly to the silicide layer 20 formed on the surface of the gate electrode 5 in accordance with the embodiment 1.

Figure 14:
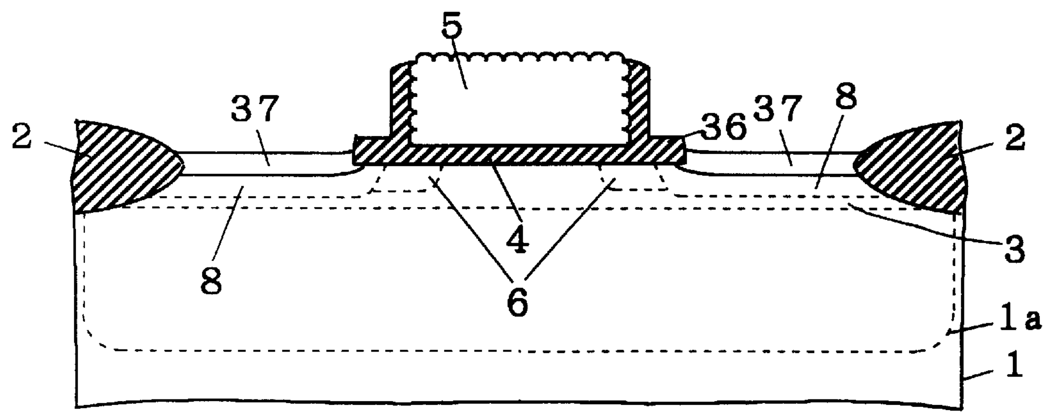
FIG. 14 and FIG. 15 are sectional views for illustrating a second method of fabricating a MOS transistor according to the embodiment 2 of the present invention.
Figure 15:
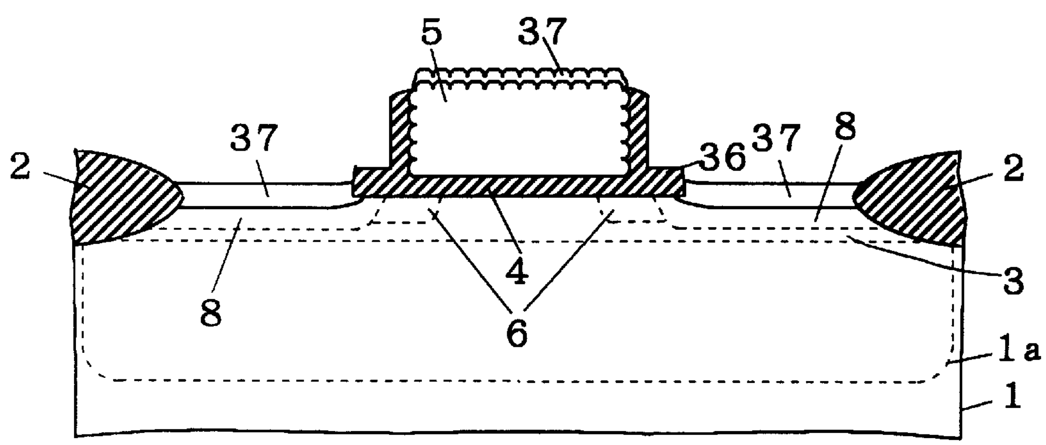

While the amorphous silicon film 30 is roughened before patterned for forming the gate electrode 5 in the embodiment 2, the surface of the gate electrode 5 consisting of amorphous silicon may alternatively be roughened by forming a number of projections on the silicon surface after forming the gate electrode 5 and before forming the side walls 7. FIG. 14 shows a sectional shape of a roughened gate electrode consisting of polycrystalline silicon. FIG. 15 shows silicide layers 37 formed by applying a salicide process to a silicon substrate 1 shown in FIG. 14.

The fabrication method according to the embodiment 2 can also be applied to a silicide wire similarly to the embodiment 1, for attaining a similar effect on the silicide wire which is refined similarly to the gate electrode.

Embodiment 3

A method of fabricating a MOS transistor according to an embodiment 3 of the present invention and a MOS transistor formed by the same are described with reference to FIGS. 16 to 19. FIGS. 16 to 19 are sectional views showing steps of fabricating a MOS transistor according to the embodiment 3 of the present invention. This MOS transistor is fabricated by application of the inventive silicide layer forming method.

First, a silicon substrate 1 is so prepared that a polycrystalline silicon film 31 provided with a number of projections 32 shown in FIG. 10 is deposited thereon, similarly to the fabrication method according to the embodiment 2.

Figure 16:
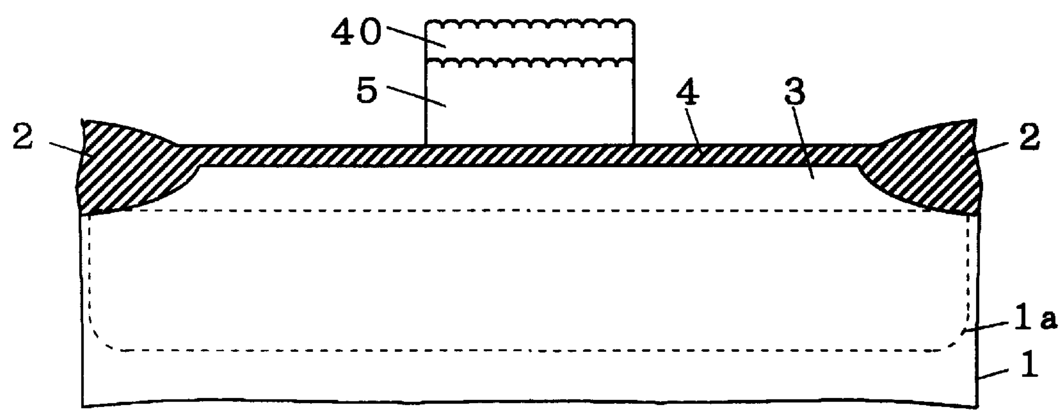

Then, a stacked film is deposited on the polycrystalline silicon film 31 by about 500 Åm, for example. The stacked film is prepared from silicon nitride, for example. A resist film is patterned by a photolithographic step, thereafter the stacked film is anisotropically etched, and the etched stacked film is employed as a mask for anisotropically etching the polycrystalline silicon film 31, thereby forming a gate electrode 5. At this time, a cap layer 40 having projections/depressions is formed on the gate electrode 5, as shown in FIG. 16.

Figure 17:
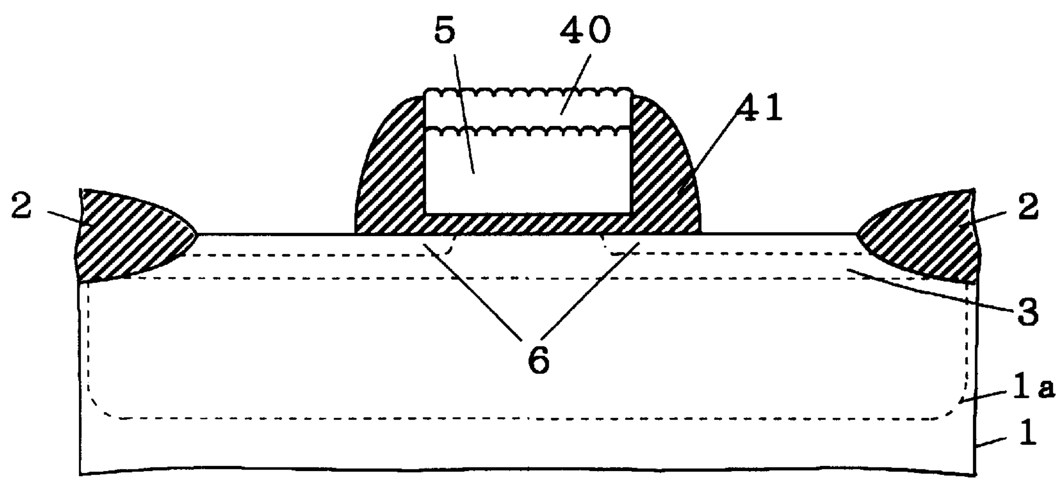
Figure 18:
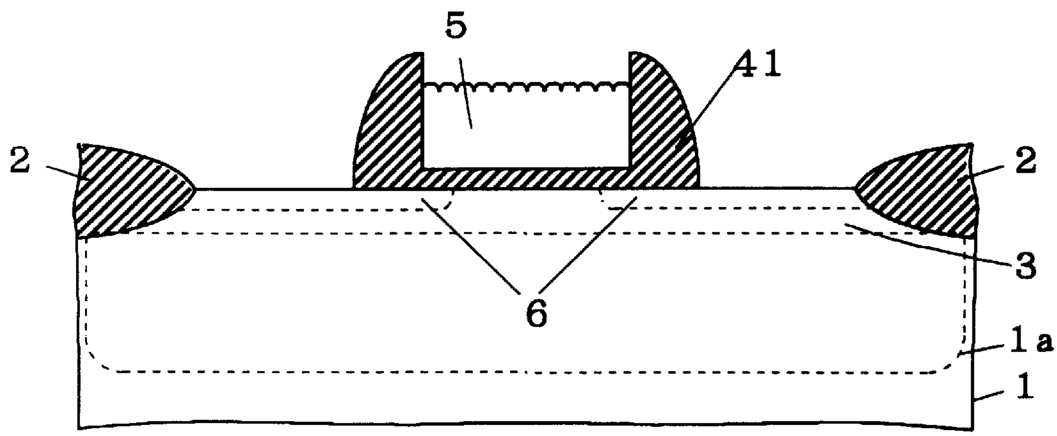
Figure 22:
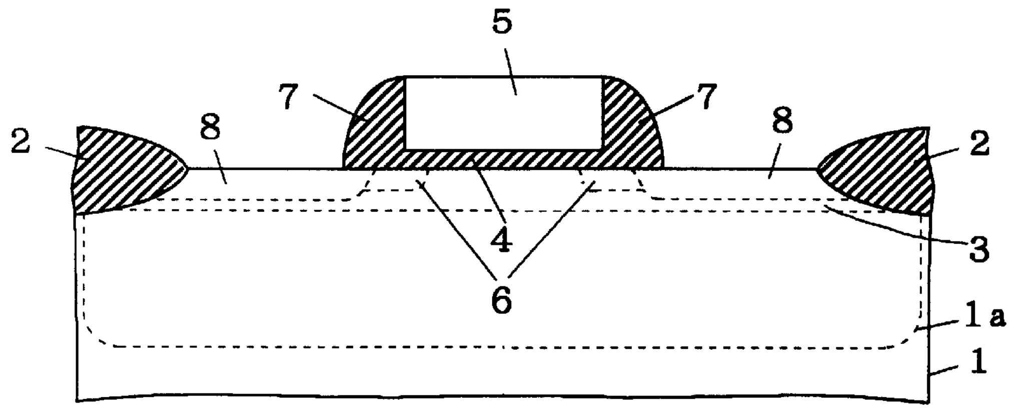
FIG. 22 to FIG. 25 are sectional views for illustrating an exemplary conventional method of fabricating a MOS transistor.
Figure 23:
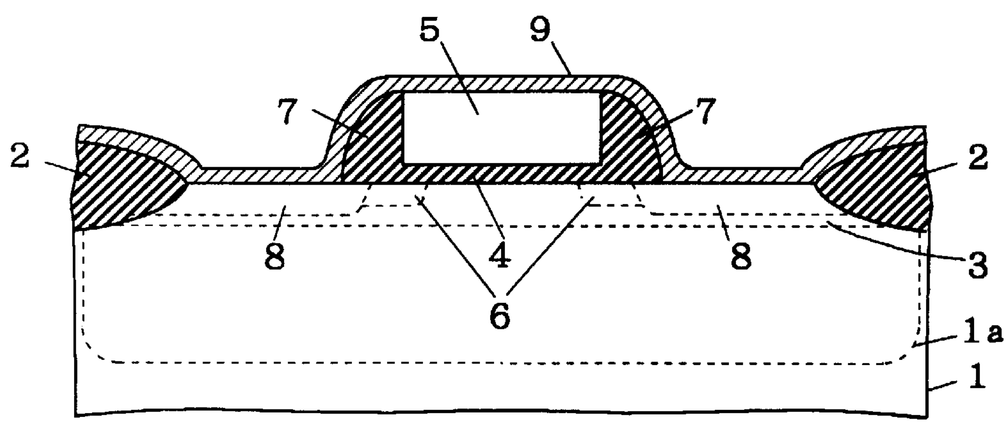
Figure 24:
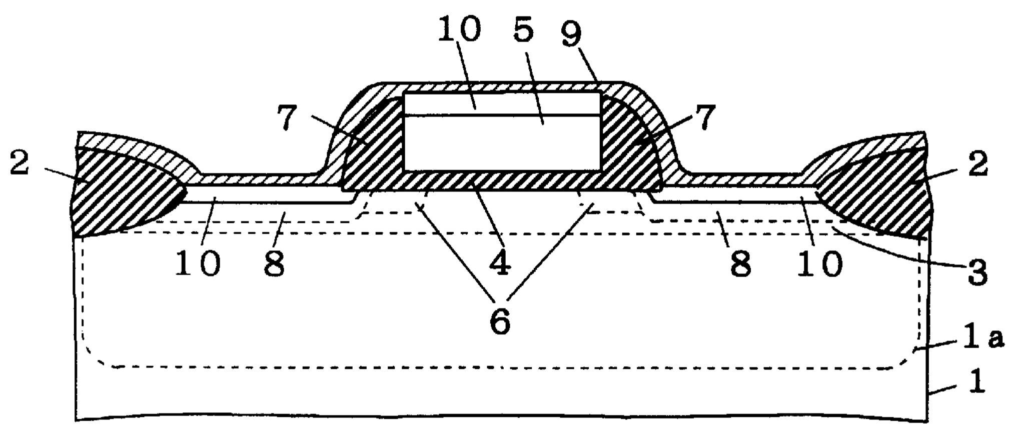
Figure 25:
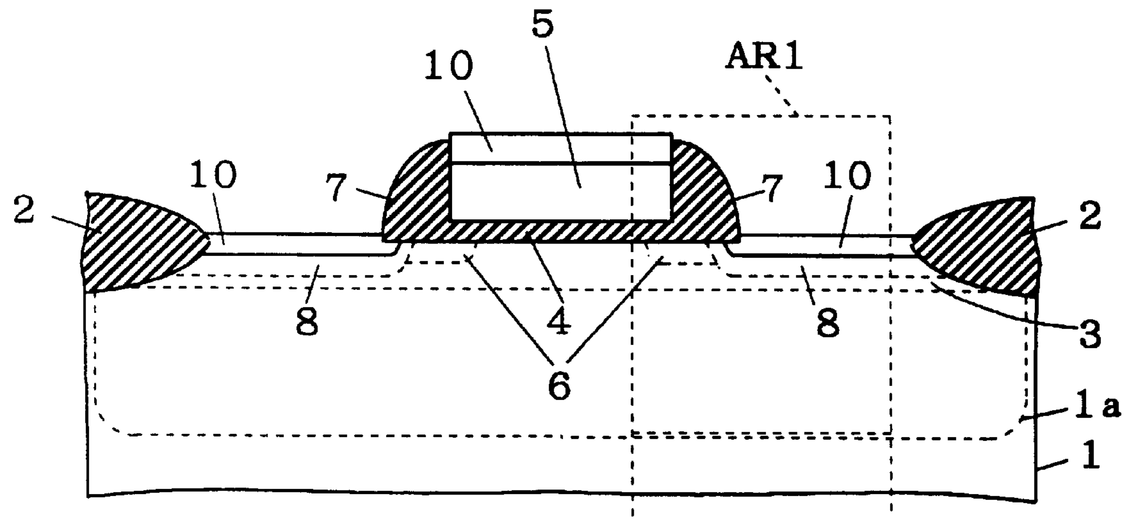

After formation of LDD layers 6, a silicon oxide film is deposited by CVD as an insulating film of about 600 to 1500 Å for forming side walls, for example. The silicon oxide film is etched back by RIE, for forming side walls 41, as shown in FIG. 17. At this time, etching conditions are so set that the cap layer 40 made of silicon nitride remains after the silicon oxide film is etched back.

Then, the silicon nitride film is etched with hot phosphoric acid hardly corroding polycrystalline silicon and silicon oxide respectively, for removing the cap layer 40. The side walls 41 formed in the aforementioned manner are higher than the gate electrode 5 (see FIG. 18).

Then, high-concentration source/drain layers 8 are formed. Thereafter silicide layers 45 are formed on surfaces of the gate electrode 5 and the high-concentration source/drain layers 8 respectively through a salicide process similarly to the prior art, as shown in FIG. 19.

The MOS transistor fabricated in the aforementioned manner has the high side walls 41, whereby the distances between the side walls 41 which are electrically connected with the gate electrode 5 and the high-concentration source/drain layers 8 are increased in the fabrication steps as compared with side walls of general height. Thus, it is possible to suppress occurrence of short-circuiting across the gate electrode 5 and the source/drain layers 8 caused by silicide creeping along the surfaces of the side walls 41. When the gate electrode 5 is roughened, the possibility of short-circuiting across the gate electrode 5 and the source/drain layers 8 may be increased due to the roughening. Therefore, it is particularly effective to increase the height of the side walls 41.

The sheet resistance of the gate electrode 5 can be reduced by the silicide layer 42, similarly to the embodiments 1 and 2.

While the cap layer 40 is made of silicon nitride in the aforementioned embodiment, the cap layer 40 may be prepared from any material so far as the same can be etched with sufficient selectivity for the side walls 41 and the gate electrode 5.

While the amorphous silicon film 30 is roughened before patterned for forming the gate electrode 5 in the embodiment 3, the surface of the gate electrode 5 consisting of amorphous silicon may alternatively be roughened by forming a number of projections on the silicon surface after forming the gate electrode 5 and before forming the side walls 7. FIG. 20 shows a sectional shape of a roughened gate electrode consisting of polycrystalline silicon. FIG. 21 shows silicide layers 37 formed by applying a salicide process to a silicon substrate 1 shown in FIG. 20.

The fabrication method according to the embodiment 3 can be applied to a silicide wire similarly to the embodiment 1, to attain a similar effect on the silicide wire which is refined similarly to the gate electrode.

While the conductor member is prepared from silicon in each of the aforementioned embodiments, a silicon layer may be formed on a partial surface of the conductor member, to attain an effect similar to those of the aforementioned embodiments.

While the invention has been shown and described in detail, the foregoing description is in all aspects illustrative and not restrictive. It is therefore understood that numerous modifications and variations can be devised without departing from the scope of the invention.

We claim:

1. A semiconductor integrated circuit comprising:

an insulating film;

a conductive member being provided on said insulating film and insulated by said insulating film for supplying an electric charge; and side walls being provided on said insulating film and holding said conductive member, said conductive member including a silicide layer being provided on its surface with a number of undulations having semispherical projections, said conductive member, being held between said side walls, having only a width being not more than $(2/\pi)$ times a width hardly causing phase transition of silicide when said silicide layer is flatly formed, said semispherical projections having a radius smaller than $(2/\pi)$ times said width hardly causing the phase transition.

2. The semiconductor integrated circuit in accordance with claim 1, wherein said silicide layer includes titanium silicide and a width of the silicide layer is not more than 0.5 $\mu$m.

3. The semiconductor integrated circuit in accordance with claim 2, wherein the width of said silicide layer is larger than $1/\pi$ $\mu$m.

* * * * *